US006622294B2

United States Patent
Saxena et al.

(10) Patent No.: US 6,622,294 B2
(45) Date of Patent: Sep. 16, 2003

(54) ADAPTIVE POWER ROUTING AND SHIELD SHARING TO REDUCE SHIELD COUNT

(75) Inventors: Prashant Saxena, Portland, OR (US); Satyanarayan Gupta, Portland, OR (US)

(73) Assignee: Intel Corporation, Santa Clara, CA (US)

(*) Notice: Subject to any disclaimer, the term of this patent is extended or adjusted under 35 U.S.C. 154(b) by 67 days.

(21) Appl. No.: 09/967,797

(22) Filed: Sep. 28, 2001

(65) Prior Publication Data

US 2003/0066041 A1 Apr. 3, 2003

(51) Int. Cl.[7] .............................................. G06F 17/50
(52) U.S. Cl. ........................................ 716/13; 716/14
(58) Field of Search ...................................... 716/13, 14

(56) References Cited

U.S. PATENT DOCUMENTS

| | | | | |
|---|---|---|---|---|
| 3,621,208 A | * | 11/1971 | Isett et al. ...................... | 716/12 |
| 5,337,252 A | * | 8/1994 | Lac et al. ....................... | 716/12 |
| 5,502,644 A | * | 3/1996 | Hamilton et al. ............... | 716/5 |
| 5,568,395 A | * | 10/1996 | Huang ............................ | 716/4 |
| 5,677,847 A | * | 10/1997 | Walling ......................... | 716/1 |
| 5,901,063 A | * | 5/1999 | Chang et al. ................... | 716/14 |
| 5,987,241 A | * | 11/1999 | Goldberg et al. ............... | 716/6 |
| 6,029,117 A | * | 2/2000 | Devgan ......................... | 702/58 |
| 6,058,256 A | * | 5/2000 | Mellen et al. .................. | 716/12 |
| 6,189,133 B1 | * | 2/2001 | Durham et al. ................. | 716/12 |
| 6,266,802 B1 | * | 7/2001 | Malm et al. .................... | 716/12 |
| 6,305,004 B1 | * | 10/2001 | Tellez et al. .................... | 716/12 |
| 6,353,917 B1 | * | 3/2002 | Muddu et al. ................... | 716/6 |
| 6,385,758 B1 | * | 5/2002 | Kikuchi et al. ................. | 716/2 |
| 6,397,169 B1 | * | 5/2002 | Shenoy et al. .................. | 703/14 |
| 6,438,736 B1 | * | 8/2002 | Zahar ............................ | 716/12 |
| 6,467,069 B2 | * | 10/2002 | Mehrotra et al. ............... | 716/4 |
| 6,467,074 B1 | * | 10/2002 | Katsioulas et al. ............. | 716/17 |
| 6,490,708 B2 | * | 12/2002 | Cohn et al. ..................... | 716/4 |
| 6,510,545 B1 | * | 1/2003 | Yee et al. ....................... | 716/12 |
| 6,530,066 B1 | * | 3/2003 | Ito et al. ......................... | 716/5 |
| 6,532,574 B1 | * | 3/2003 | Durham et al. ................. | 716/6 |
| 2001/0010090 A1 | * | 7/2001 | Boyle et al. .................... | 716/2 |
| 2001/0034875 A1 | * | 10/2001 | Nakayama et al. ............. | 716/15 |
| 2002/0078425 A1 | * | 6/2002 | Mehrotra et al. ............... | 716/6 |
| 2002/0112212 A1 | * | 8/2002 | Cohn et al. ..................... | 716/1 |
| 2002/0133791 A1 | * | 9/2002 | Cohn et al. ..................... | 716/4 |

FOREIGN PATENT DOCUMENTS

JP          05283615 A   * 10/1993   ........... H01L/27/04

OTHER PUBLICATIONS

NB9406185, "Statistical Method of Noise Estimation in a Synchronous System", IBM Technical Disclosure Bulletin, vol. 37, No. 6B, Jun. 1994, pp. 185–194 (16 pages).*

(List continued on next page.)

Primary Examiner—Matthew Smith
Assistant Examiner—Phallaka Kik
(74) Attorney, Agent, or Firm—Blakely, Sokoloff, Taylor & Zafman LLP

(57) ABSTRACT

Described herein are two techniques referred to as "Adaptive Power Routing" and "Shield Sharing To Reduce Shield Count," that allow power routing and signal routing to be integrated in a manner that provides more efficient and compact layout of design blocks as compared to traditional techniques. Adaptive power routing refers to completion of power routing to be postponed to the signal routing phase, at which time signal shielding requirements are also used to complete the power routing along with predefined power delivery constraints. Shield sharing optimization refers to the more efficient use of previously routed power lines and to the insertion of a reduced number of additional power lines so as to satisfy both shielding requirements and power supply requirements in a gridless environment. These two techniques allow routing in highly congested regions containing performance-critical and/or noise-sensitive signals to be manufactured using less die area than would be required with traditional routing methodologies and algorithms.

22 Claims, 4 Drawing Sheets

OTHER PUBLICATIONS

Cao et al., "Effects of Global Interconnect Optimizations on Performance Estimation of Deep Submicron Design", IEEE/ACM International Conference on Computer Aided Design, Nov. 5, 2000, pp. 56–61.*

Zheng et al., "Noise Margin Constraints for Interconnectivity in Deep Submicron Low Power and Mixed–Signal VLSI Circuits", Proceedings of 20th Anniversary Conference on Advanced Research in VLSI, Mar. 21, 1999, pp. 123–136.*

Yao et al., "An Efficient Power Routing Technique to Resolve the Current Crowding Effect in the Power Grid Structure of Gate Arrays", Proceedings of Seventh Annual IEEE International ASIC Conference and Exhibit, Sep. 19, 1994, pp. 134–137.*

Laszlo Gal, "On–Chip Cross Talk—The New Signal Integrity Challenge," Proc. CICC '95, IEEE, pp. 12.1.1–12.1.4, Jan. 1995.

Laurence H. Cooke, et al., "Signal Integrity Effects in System–on–Chip Designs–A Designer's Perspective," Book chapter appearing in: "Signal Integrity Effects in Custom IC and ASIC Designs", R. Singh (ed.), IEEE, 2001, pp. 1–11, Jan. 2001.

Lei He; Kevin M. Lepak, "Simultaneous Shield Insertion and Net Ordering for Capacitive and Inductive Coupling Minimization," Proc. ISPD 2000, pp. 55–60, Apr. 9, 2000.

Naveed Sherwani, "Algorithms for VLSI Physical Design Automation," 3rd Edition, Published by Kluwer Academic Publishers, 1999, pp. 191–218, 291–415, 440–444, Jan. 1999.

* cited by examiner

ADAPTIVE POWER ROUTING AND SHIELD SHARING TO REDUCE SHIELD COUNT

FIELD

The invention relates to integrated circuit layout. More particularly, the invention relates to area-efficient techniques for placing and routing signal nets and power and ground supply lines in an integrated device layout to control electrical cross-coupling between adjacent signal lines.

BACKGROUND

As processes for manufacturing integrated devices allow minimum line sizes to decrease, the potential for interconnect noise due to switching cross-coupling capacitance increases. This switching cross-coupling capacitance increases the difficulty of converging high performance circuits by widening the transition windows of signals to account for unpredictable transition states of neighboring signals, as well as by causing failures. Convergence refers to conditions under which all timing requirements are met.

In view of this situation, designers often attempt to reduce switching cross-coupling capacitance by shielding sensitive signal nets using power supply (Vcc) or ground (Vss) lines. The set of lines providing any combination of a positive supply voltage, a negative supply voltage and/or ground are referred to herein as "power lines." Shielding can be accomplished by placing sensitive signal nets adjacent to pre-existing power lines or by adding power lines adjacent to the sensitive signal lines for the purpose of shielding.

With the effects of switching cross-coupling capacitance increasing with each generation of integrated device manufacturing processes, the proportion of signals requiring shielding, and consequently the area used by the shields also increases. Because design blocks layouts are often wire-limited, an increase in the number of power lines required solely for shielding increases the die area required to manufacture the integrated device.

Furthermore, detailed shielding requirements are available only at late stages in the design process, at which time the die area available to lay out each converged design block may already have been allocated. In such a scenario, if the layout of a converged design block cannot be carried out in its planned area, extensive delays can be incurred due to redesign of the surrounding design blocks.

L. He, "Simultaneous Shield Insertion and Net Ordering for Capacitive and Inductive Coupling Minimization," Proc. ISPD'00 (hereinafter "the He Paper") discloses a technique for integrated shielding and signal net ordering. However, the He Paper focuses on signal net ordering and shield insertion primarily for inductive noise under a simplistic model and is not well suited to layouts containing may prerouted signal nets and shields, which is common. Furthermore, the He Paper does not address either shield sharing or power grid perturbation.

BRIEF DESCRIPTION OF THE DRAWINGS

The invention is illustrated by way of example, and not by way of limitation, in the figures of the accompanying drawings in which like reference numerals refer to similar elements.

DETAILED DESCRIPTION

Figure 1:
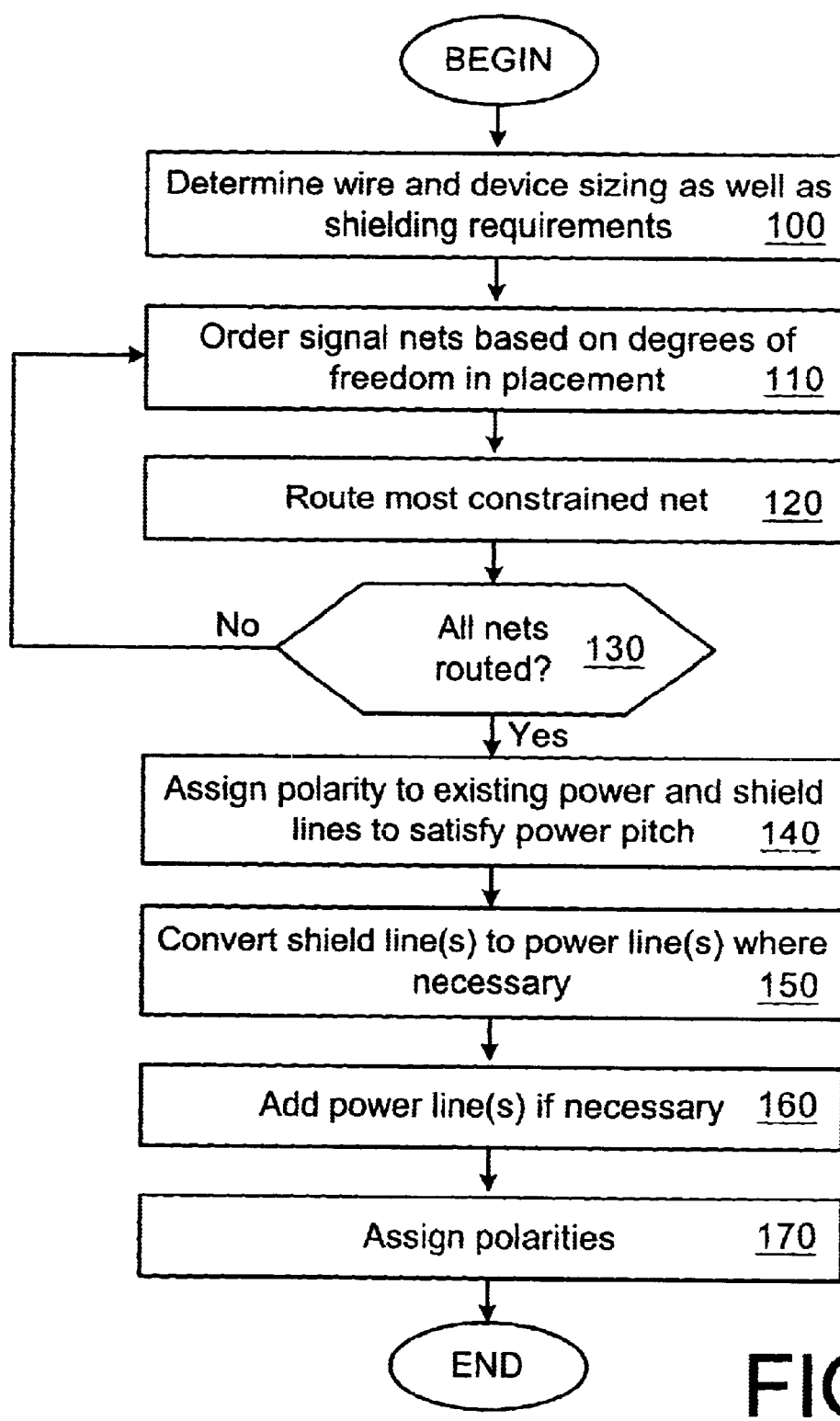
FIG. 1 is one embodiment of a flow diagram for power supply and signal net routing.

Techniques for power supply routing in an integrated device such that the power supply lines are used to shield signal lines are described. In the following description, for purposes of explanation, numerous specific details are set forth in order to provide a thorough understanding of the invention. It will be apparent, however, to one skilled in the art that the invention can be practiced without these specific details. In other instances, structures and devices are shown in block diagram form in order to avoid obscuring the invention.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

It has been noted by design engineers in the field of integrated circuit (IC) design that process migration often results in an increase in interconnect noise induced due to switching cross-capacitance, which results in increasing difficulty in designing functional circuits. Furthermore, switching cross-capacitance increases the difficulty of converging high performance circuits by widening the transition windows of signals to account for unpredictable transition states of neighboring signals.

In view of these factors, circuit designers attempt to minimize switching cross-capacitance by shielding sensitive signal nets using power supply (Vcc) and ground (Vss) lines (collectively "power lines"). As described herein, by integrating two traditionally disjoint phases of the layout process (viz., power routing and signal routing) in a way that satisfies both shielding and power delivery integrity constrains while using a reduced number of power lines, the disadvantages of traditional technologies can be overcome.

Described herein are two techniques referred to as "Adaptive Power Routing" and "Shield Sharing To Reduce Shield Count," that allow power routing and signal routing to be integrated in a manner to provide more efficient and compact layout of design blocks as compared to traditional techniques. Adaptive power routing refers to a technique that allows the completion of power routing to be postponed to the signal routing phase, at which time signal shielding requirements are also used to complete the power routing along with predefined power delivery constraints. The phrase "design block" refers to a collection of circuit elements.

Shield sharing to reduce shield count refers to a technique to use previously routed power lines more efficiently and to insert a reduced number of additional power lines so as to satisfy the shielding requirements of delay- and/or noise-sensitive signals. In one embodiment, this can be accomplished efficiently in a gridless routing environment. This technique along with adaptive power routing allows routing in regions containing sensitive signals (e.g., dynamic logic circuits) to be completed using less die area than would be required with traditional routing methodologies and algorithms.

In general, unlike traditional routing methodologies where power routing is completed prior to signal routing, the technique described herein results in a postponement of detailed power routing until later in the layout flow by integrating the detailed power routing adaptively into signal routing as described with respect to FIG. 1, which is a flow diagram of one embodiment of a technique for power supply and signal net routing. If a local region has insufficient shields subsequent to signal routing, additional power lines can be inserted as part of the adaptive power routing in order to maintain power delivery integrity.

Prior to layout, the timing and noise characteristics of the circuit are analyzed to determine wire and device sizes as well as the shielding requirements for signal nets, 100. Signal nets are ordered by the degree of freedom in their placement and by their shielding requirements, 110. In one embodiment, the degree of freedom of a signal net is determined by the number of available tracks within the cumulative span of its driver(s) and by the number of shields required by the signal net.

In one embodiment, the most constrained signal net is routed gridlessly along with any associated shields, 120. Using the ordering described above, each signal net is placed so as to reuse previously routed shields as much as possible. During this process, 125, the ordering of the signal nets is dynamically updated, 110, with the most constrained remaining signal net and shields being routed at each stage, 120. The reordering and placement of signal nets and associated shields, if any, is repeated until all signal nets are routed, 130. At this stage, the polarity of the shields is unassigned.

The polarity of the existing power lines as well as existing and newly inserted shield lines is assigned in a manner to satisfy the power pitch, 140. The power pitch is the maximum allowable distance between adjacent power lines of opposite polarities for a particular manufacturing process. The power pitch is a predetermined value that is known prior to layout of signal nets and power lines. If assigning of polarities to the shield lines does not provide enough power lines to satisfy the power pitch, new power lines are inserted, 150.

In one embodiment, the region as defined by a previous power line and the routing track one power pitch beyond that power line is iteratively searched for shields starting from the far end of the region and moving toward the existing power line. If a shield is found, that shield is treated as part of the power grid and assigned a polarity opposite of the previous power line. Thus, the separation between the existing power line and the new power line is no greater than the power pitch in this case, thus ensuring power delivery integrity. More significantly, no new power line needs to be added in this case in contrast to traditional routing methodologies.

A new power line is explicitly added, 160, only if no shield exists within the power pitch region. Even in this case, the techniques described herein provide more efficient routing completion than traditional techniques by allowing the power lines to be assigned to any unused track over a region of equal width to the power pitch. In contrast, traditional non-adaptive power routing requires that the power line be added to a considerably smaller region. Thus, the number of power lines in the layout is less than a corresponding layout using traditional methodologies, which results in a more compact layout.

The shields that have not had polarities assigned are assigned, 170. In one embodiment, these shields are assigned Vss; however, these shields can also be assigned Vcc.

Figure 4:
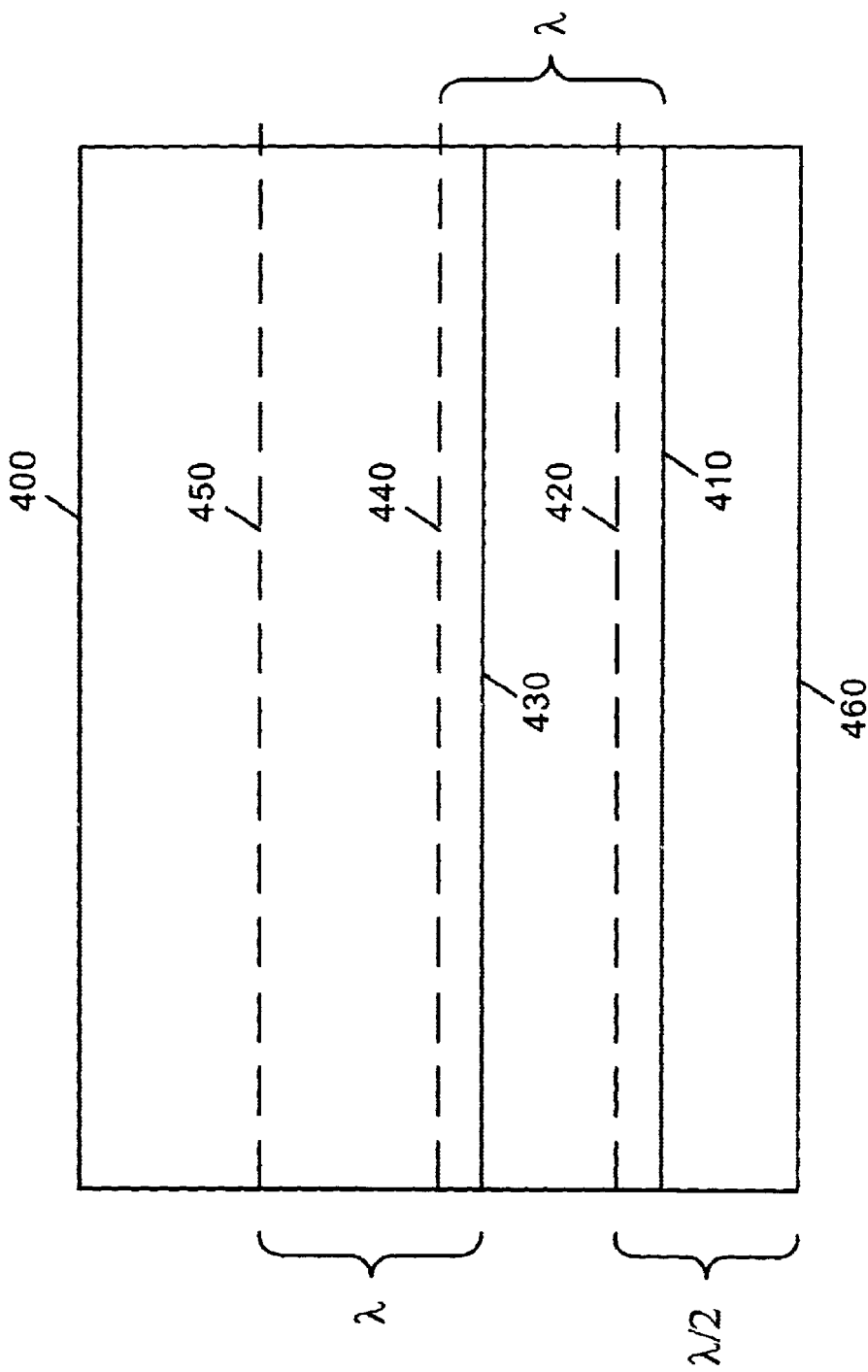
FIG. 4 illustrates adaptive power routing in an integrated circuit design block.

FIG. 4 illustrates an integrated circuit design block. Integrated design block 400 includes multiple signal nets and their associated shield lines that are not illustrated for reasons of simplicity of description. In one embodiment, after signal nets and associated shield lines are routed, a power grid is extracted from the existing shield lines as much as possible with additional power lines being explicitly added only where necessary to satisfy power delivery requirements.

In one embodiment, extraction of a power grid from shield lines placed in integrated circuit design block 400 starts at boundary 460. Any boundary can be used as a starting point and non-boundary starting points can also be used. A first region is defined with respect to boundary 460. In one embodiment, the first region is one half of a power pitch ($\lambda/2$); however, the first region can be defined in another manner.

The first region is searched starting at boundary (dashed line) 420 opposite starting boundary 460. The dashed lines of FIG. 4 are for illustration purposes only and are not part of the integrated circuit design block layout. The tracks of the first region are searched for a shield line that is the greatest distance from boundary 460. In the example of FIG. 4, shield line 410 is the shield line within the first region that is the greatest distance from boundary 460. Shield line 410 is used as part of the power grid and assigned a polarity (either Vcc or Vss).

A second region of design block 400 is defined based on shield/power line 410 as the starting boundary. In one embodiment, regions beyond the first region are defined as a power pitch ($\lambda$) or the boundary of the design block, whichever is smaller. Thus, the second region is defined by shield/power line 410 and dashed line 440.

The second region is searched from dashed line 440 toward shield/power line 410 to find a shield line that is the greatest distance from shield/power line 410, if any. In the example of FIG. 4, shield line 430 is the shield line in the second region that is the greatest distance from shield/power line 410. Shield line 430 is used as part of the power grid and assigned a polarity opposite of shield/power line 410.

A third region of design block 400 is defined based on shield/power line 430 as the starting boundary. Using a power pitch distance, the third region is defined by shield/power line 430 and dashed line 450. As described above, the third region is searched from dashed line 450 to shield/power line 430 to find a shield line that is the greatest distance from shield/power line 430. In the example of FIG. 4, no shield line exists in the third region. If no usable shield line exists, a power line (not shown in FIG. 4) is explicitly added to design block 400 in a vacant track in the third region that is farthest from shield/power line 430 in order to satisfy power delivery requirements.

Figure 2:
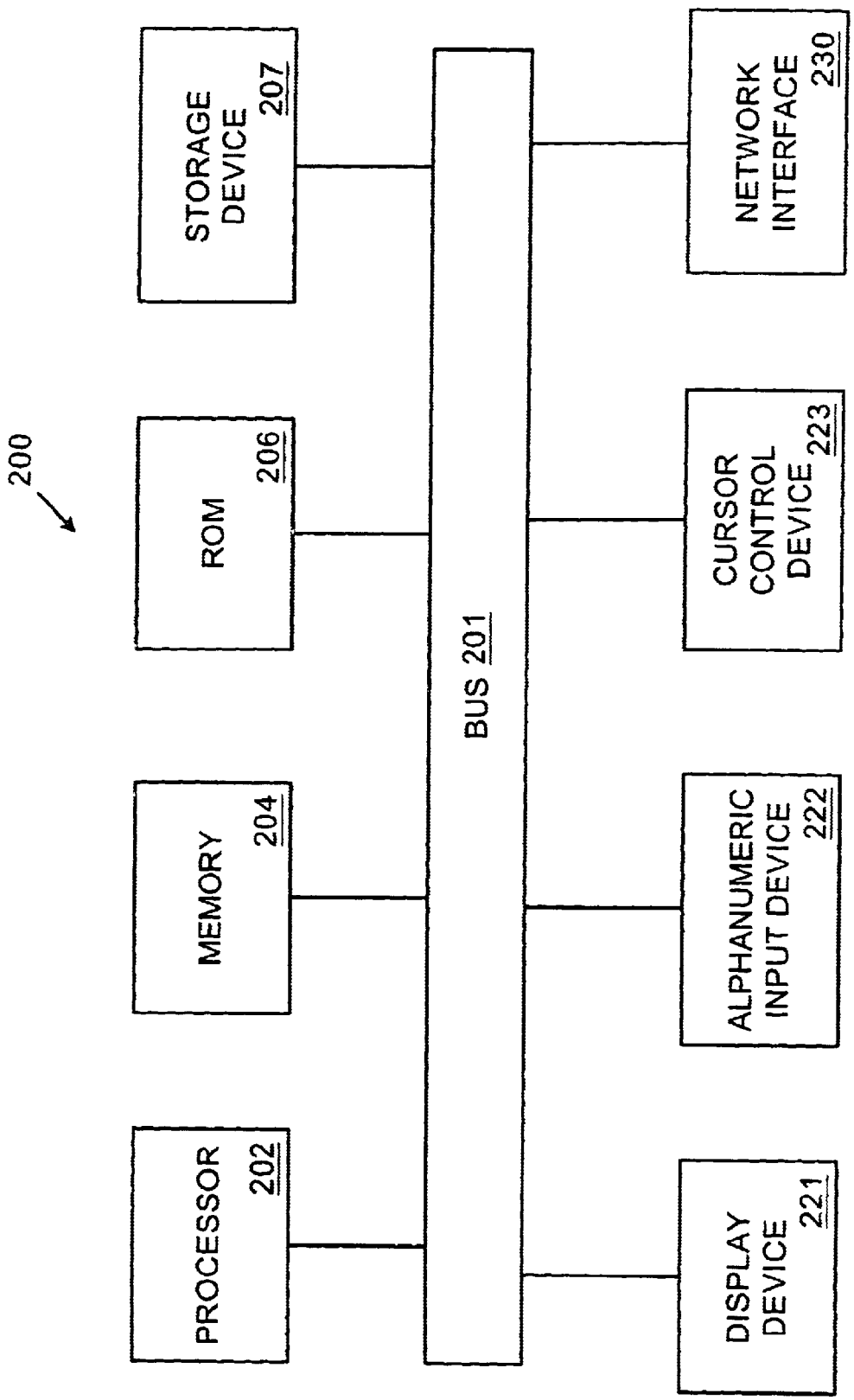
FIG. 2 illustrates a block diagram of one embodiment of an electronic system.

In one embodiment, the technique described herein is implemented as sequences of instructions executed by an electronic system. The sequences of instructions can be stored by the electronic device or the instructions can be received by the electronic device (e.g., via a network connection). FIG. 2 is a block diagram of one embodiment of an electronic system. The electronic system illustrated in FIG. 2 is intended to represent a range of electronic systems, for example, computer systems, network access devices, etc. Alternative electronic systems can include more, fewer and/or different components.

Electronic system 200 includes bus 201 or other communication device to communicate information, and processor 202 coupled to bus 201 to process information. While electronic system 200 is illustrated with a single processor, electronic system 200 can include multiple processors and/or co-processors. Electronic system 200 further includes random access memory (RAM) or other dynamic storage device 204 (referred to as memory), coupled to bus 201 to store information and instructions to be executed by processor 202. Memory 204 also can be used to store temporary variables or other intermediate information during execution of instructions by processor 202.

Electronic system 200 also includes read only memory (ROM) and/or other static storage device 206 coupled to bus 201 to store static information and instructions for processor 202. Data storage device 207 is coupled to bus 201 to store information and instructions. Data storage device 207 such as a magnetic disk or optical disc and corresponding drive can be coupled to electronic system 200.

Electronic system 200 can also be coupled via bus 201 to display device 221, such as a cathode ray tube (CRT) or liquid crystal display (LCD), to display information to a computer user. Alphanumeric input device 222, including alphanumeric and other keys, is typically coupled to bus 201 to communicate information and command selections to processor 202. Another type of user input device is cursor control 223, such as a mouse, a trackball, or cursor direction keys to communicate direction information and command selections to processor 202 and to control cursor movement on display 221. Electronic system 200 further includes network interface 230 to provide access to a network, such as a local area network.

Instructions are provided to memory from a storage device, such as magnetic disk, a read-only memory (ROM) integrated circuit, CD-ROM, DVD, via a remote connection (e.g., over a network via network interface 230) that is either wired or wireless providing access to one or more electronically-accessible media, etc. In alternative embodiments, hard-wired circuitry can be used in place of or in combination with software instructions. Thus, execution of sequences of instructions is not limited to any specific combination of hardware circuitry and software instructions.

An electronically-accessible medium includes any mechanism that provides (i.e., stores and/or transmits) content (e.g., computer executable instructions) in a form readable by an electronic device (e.g., a computer, a personal digital assistant, a design blockular telephone). For example, a machine-accessible medium includes read only memory (ROM); random access memory (RAM); magnetic disk storage media; optical storage media; flash memory devices; electrical, optical, acoustical or other form of propagated signals (e.g., carrier waves, infrared signals, digital signals); etc.

Figures 3A, 3B:
FIG. 3a illustrates a sample routing of signal nets and power lines using traditional routing methodologies.
FIG. 3b illustrates the routing of the signal nets and of power lines using adaptive power routing and shield sharing to reduce shield count.

To illustrate the results of signal net routing and power routing using the techniques described herein, FIGS. 3a and 3b illustrate signal net routing and power routing using traditional techniques and using adaptive power routing and shield sharing, respectively. In FIGS. 3a and 3b, the solid lines represent signal nets (labeled Ni), with the numbers in parenthesis indicating the number of shields required by the associated signal nets. In FIG. 3a, the dotted lines represent the power lines, with the heavy dotted lines representing the power tracks assigned during the power routing phase prior to signal routing.

Traditional routing methodologies tend to produce trace assignments similar to FIG. 3a because these methodologies do not order the signal nets according to shielding requirements to reduce the overall number of shields required. Thus, once signal net N1 has been routed, signal net N2 is routed in the next available track along with any required shields.

In contrast, the technique described herein results in a layout like the one in FIG. 3b. Using this methodology, the signal nets to be routed in this region are reordered so as to share as many shields as possible (e.g., between signal nets N2 and N4). As a result, additional power lines are often not required (as in the lower portion of FIG. 3b) because power can be adequately delivered through the shields that have been routed during signal net routing.

However, because signal routing and the associated shield placement does not provide adequate power to the top portion of the layout of FIG. 3b, an additional power track as represented by the heavy dotted line in FIG. 3b is assigned to be Vcc or Vss, with polarity assigned as needed, to meet power delivery constraints.

As can be seen from FIGS. 3a and 3b, the layout produced using the adaptive power routing and shield sharing techniques results in a more compact layout than that using traditional techniques. Adaptive power routing and shield sharing thus satisfy signal routing, signal shielding and power delivery constraints in a more efficient manner than traditional techniques.

The signal net and power delivery routing techniques described herein are most effective when used on middle metal layers. The technique is less effective when used on upper metal layers where long range matching of power networks is a stringent requirement. However, in layers where power networks of adjacent design blocks are generally not required to match exactly because of dense connections through the upper layers, the techniques described herein are more effective.

In the foregoing specification, the invention has been described with reference to specific embodiments thereof. It will, however, be evident that various modifications and changes can be made thereto without departing from the broader spirit and scope of the invention. The specification and drawings are, accordingly, to be regarded in an illustrative rather than a restrictive sense.

What is claimed is:

1. A method comprising:
   determining a priority for a placement of a set of signal lines in a gridless layout of an integrated device by prioritizing the signal lines based on geometric constraints, shielding constraints and previously routed signal and/or power lines;
   placing a most constrained signal line from the set of signal lines based on previously routed signal lines, previously routed power lines and/or shielding requirements, wherein placing the most constrained signal line comprises placing a selected signal line in a first available track, possibly adjacent to a previously placed shield line and/or a previously placed power line and placing a shield line without an associated polarity, if necessary, adjacent to the placed selected signal line according to a predetermined policy;
   re-determining the priority of the remaining signal lines in the set of signal lines; and
   assigning polarities to shield lines previously placed without associated polarities such that the shielding lines and/or previously placed power lines satisfy a predetermined power pitch.

2. The method of claim 1 wherein assigning polarities to the shielding lines comprises assigning the shielding lines to be either a positive voltage supply, ground, or a negative voltage supply.

3. An integrated circuit manufactured according to the method of claim 1.

4. A method of providing adequate shielding to a congested design block of an integrated circuit layout containing critical signal nets, the method comprising:

placing signal lines for the design block according to a predetermined policy, wherein placement of the signal lines may result in movement of the previously placed power lines, and further wherein placement of the signal lines results in placement of shielding lines within the design block, the shielding lines placed without an associated polarity and adjacent to one or more critical signal lines;

providing a polarity to the shielding lines such that the combination of the power lines and the shielding lines satisfy a predetermined power pitch.

5. The method of claim 4 wherein the critical signal nets comprise noise critical signal nets.

6. The method of claim 4 wherein the critical signal nets comprise performance critical signal nets.

7. The method of claim 4 wherein placing signal lines for the design block according to a predetermined policy comprises:

determining a priority for a placement of a set of signal lines in a gridless layout of an integrated device;

placing a most constrained signal line from the set of signal lines, wherein the placement is determined based on previously routed signal lines, previously routed power lines and shielding requirements; and re-determining the priority of the remaining signal lines in the set of signal lines.

8. An integrated circuit manufactured according to the method of claim 4.

9. An article comprising a storage medium accessible by an electronic device, the storage medium to store instructions that, when executed by one or more processors, cause the one or more processors to:

determine a priority for a placement of a set of signal lines in a gridless layout of an integrated device by prioritizing the signal lines based on geometric constraints, shielding constraints and previously routed signal and/or power lines;

place a most constrained signal line from the set of signal lines based on previously routed signal lines, previously routed power lines and/or shielding requirements, wherein placing the most constrained signal line comprises placing a selected signal line in a first available track, possibly adjacent to a previously placed shield line and/or a previously place power line and placing a shield line without an associated polarity, if necessary, adjacent to the placed selected signal line according to a predetermined policy;

re-determine the priority of the remaining signal lines in the set of signal lines; and assign polarities to shield lines previously placed without associated polarities such that the shielding lines and/or previously placed power lines satisfy a predetermined power pitch.

10. The article of claim 9 wherein the instructions that cause the one or more processors to determine the priority for placement of signal lines comprise instructions that, when executed by the one or more processors, cause the one or more processors to order the signal lines based on one or more of: geometric constraints, shielding constraints and previously routed signal and/or power lines.

11. The article of claim 9 wherein the instructions that cause the one or more processors to assign polarities to the shielding lines comprise instructions that, when executed by the one or more processors, cause the one or more processors to assign the shielding lines to be either a positive voltage supply, ground, or a negative voltage supply.

12. An article comprising an electronically accessible medium to store instructions to providing adequate shielding to a congested design block of an integrated circuit layout containing critical signal nets, the instructions, when executed by one or more processors, cause the one or more processors to:

place signal lines for the design block according to a predetermined policy, wherein placement of the signal lines may result in movement of the previously placed power lines, and further wherein placement of the signal lines results in placement of shielding lines within the design block, the shielding lines placed without an associated polarity and adjacent to one or more critical signal lines; and provide a polarity to the shielding lines such that the combination of the power lines and the shielding lines satisfy a predetermined power pitch.

13. The article of claim 12 wherein the instructions that cause the one or more processors to place signal lines for the design block according to a predetermined policy comprise instructions that, when executed by the one or more processors, cause the one or more processors to:

determine a priority for a placement of a set of signal lines in a gridless layout of an integrated device;

place a most constrained signal line from the set of signal lines, wherein the placement is determined based on previously routed signal lines, previously routed power lines and shielding requirements; and reorder the priority of the remaining signal lines in the set of signal lines.

14. A method comprising:

routing signal lines and associated shield lines for an integrated circuit layout, wherein power lines are not explicitly routed prior to routing the signal lines;

identifying shield lines for use as power lines by searching a first region with respect to a first layout boundary for a shield line, causing an identified shield line in the first region, if any, to be a power line by assigning a polarity to the identified shield line, inserting a power line in the first region if a shield line is not identified with in the first region, identifying a second region having a predetermined distance beyond the first region, identifying a shield line having a greatest distance from the first region, causing the identified shield line in the second region, if any, to be a power line by assigning a polarity to the identified shield line, wherein the polarity is opposite of the identified shield line of the first region, and inserting a power line in the second region if a shield line is not identified within the second region; and adding additional power lines to the layout explicitly if the shield lines identified for use as power lines do not meet predetermined power delivery requirements.

15. The method of claim 14 wherein routing signal lines and associated shield lines comprises dynamically determining an order for placement based on geometric constraints, shielding constraints and/or previously routed signal and/or power lines.

16. The method of claim 14 wherein routing signal lines and associated shield lines comprises:

placing a selected signal line in a first available track, possibly adjacent to a previously placed shield line and/or a previously placed power line; and placing a shield line, if necessary, adjacent to the placed selected signal line according to a predetermined policy of placing shield lines without an associated polarity.

17. The method of claim 14, wherein the predetermined distance corresponds to a power pitch distance.

18. An integrated circuit manufactured according to the method of claim 14.

19. An article comprising an electronically-accessible medium to provide access to instructions that, when executed, cause one or more processors to:

route signal lines and associated shield lines for an integrated circuit layout, wherein power lines are not explicitly routed prior to routing the signal lines;

identify shield lines for use as power lines by searching a first region with respect to a first layout boundary for a shield line, causing an identified shield line in the first region, if any, to be a power line by assigning a polarity to the identified shield line, inserting a power line in the first region if a shield line is not identified with in the first region, identifying a second region having a predetermined distance beyond the first region, identifying a shield line having a greatest distance from the first region, causing the identified shield line in the second region, if any, to be a power line by assigning a polarity to the identified shield line, wherein the polarity is opposite of the identified shield line of the first region, and inserting a power line in the second region if a shield line is not identified within the second region; and add additional power lines to the layout explicitly if the shield lines identified for use as power lines do not meet predetermined power delivery requirements.

20. The article of claim 19 wherein the instructions that cause the one or more processors to route signal lines and associated shield lines comprise instructions that, when executed, cause the one or more processors to dynamically determine an order for placement based on geometric constraints, shielding constraints and/or previously routed signal and/or power lines.

21. The article of claim 19 wherein the instructions that cause the one or more processors to route signal lines and associated shield lines comprise instructions that, when executed, cause the one or more processors to:

place a selected signal line in a first available track, possibly adjacent to a previously placed shield line and/or a previously placed power line; and place a shield line, if necessary, adjacent to the placed selected signal line according to a predetermined policy of placing shield lines without an associated polarity.

22. The article of claim 19 wherein the predetermined distance corresponds to a power pitch distance.

* * * * *